(12) United States Patent
Thurmaier

(10) Patent No.: US 6,870,362 B2
(45) Date of Patent: Mar. 22, 2005

(54) DOCKING APPARATUS

(75) Inventor: Stefan Thurmaier, Bad Aibling (DE)

(73) Assignee: Multitest elektronische Systeme GmbH, Rosenheim (DE)

( * ) Notice: Subject to any disclaimer, the term of this patent is extended or adjusted under 35 U.S.C. 154(b) by 46 days.

(21) Appl. No.: 10/412,155

(22) Filed: Apr. 11, 2003

(65) Prior Publication Data

US 2003/0218869 A1 Nov. 27, 2003

(30) Foreign Application Priority Data

Apr. 11, 2002 (DE) .......................................... 102 16 003

(51) Int. Cl.[7] .......................... G01R 31/02; G01R 31/08
(52) U.S. Cl. .................................... 324/158.1; 324/754
(58) Field of Search ................................ 324/750–765, 324/158.1, 754

(56) References Cited

U.S. PATENT DOCUMENTS

| | | | | |
|---|---|---|---|---|
| 4,665,360 A | * | 5/1987 | Phillips ....................... | 324/754 |
| 5,552,701 A | * | 9/1996 | Veteran et al. ............ | 324/158.1 |
| 5,654,631 A | * | 8/1997 | Ames ...................... | 324/158.1 |
| 6,047,541 A | * | 4/2000 | Hampsten ..................... | 60/259 |
| 6,104,202 A | | 8/2000 | Slocum et al. | |
| 6,271,658 B1 | | 8/2001 | Vallinan et al. | |

FOREIGN PATENT DOCUMENTS

EP    0 752 588 A2    8/1997

* cited by examiner

*Primary Examiner*—David Zarneke
*Assistant Examiner*—Emily Y Chan
(74) *Attorney, Agent, or Firm*—Myers & Kaplan, LLC; Joel D. Myers, Esq.; Sandra M. Sovinski, Esq.

(57) ABSTRACT

In a docking apparatus for coupling a first apparatus consisting of a handler or prober and a second apparatus consisting of a testing head for electronic components, at least one locking unit is provided having an axial insertion opening for inserting a locking pin. In the area of the insertion opening, a plurality of balls are arranged, between which the locking pin is insertable. Furthermore, a ball clamping sleeve is provided, which by means of an axial displacement causes a radial movement of the balls and therefore fixes the locking pin.

11 Claims, 5 Drawing Sheets

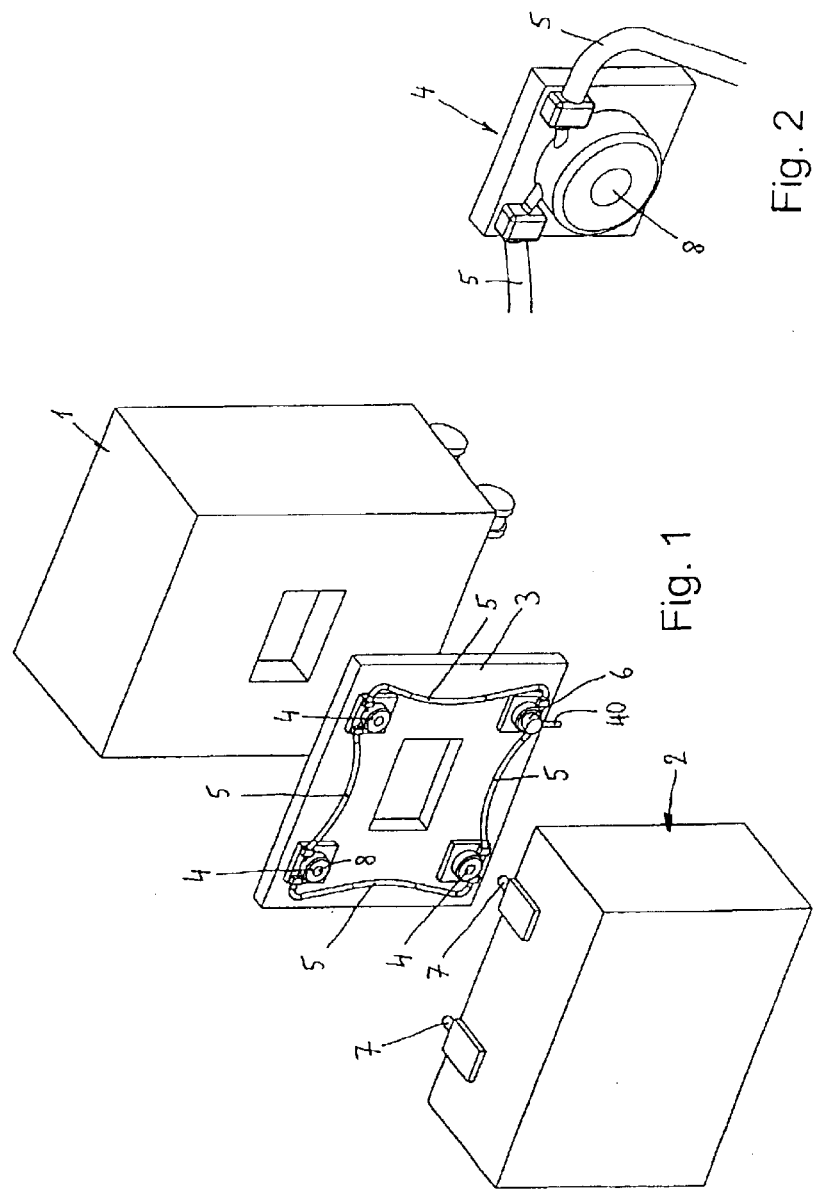

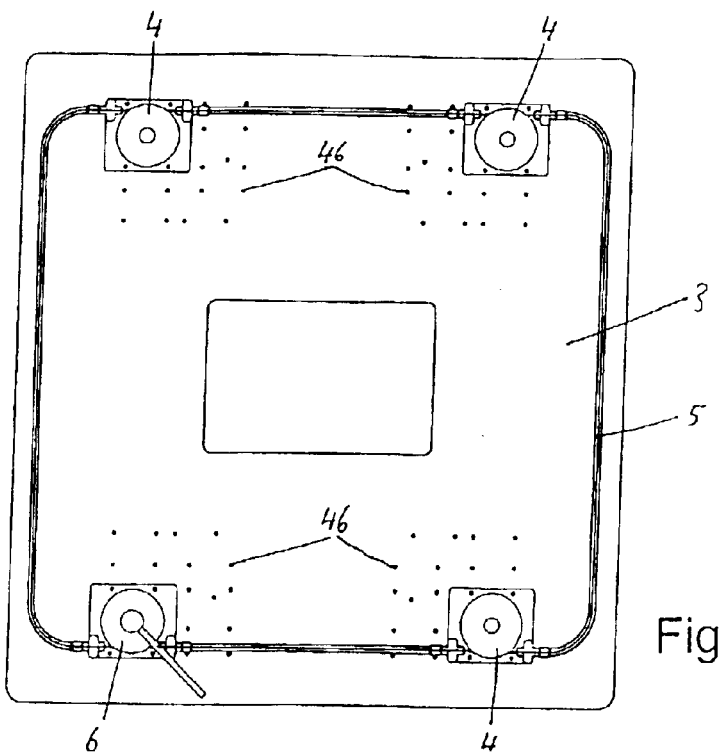
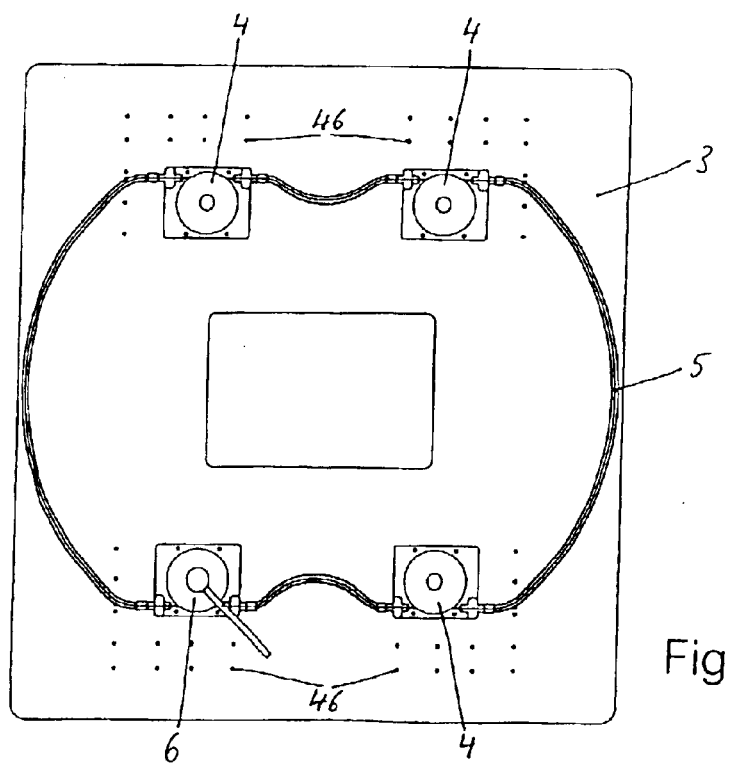
Fig. 6a
Fig. 6b

US 6,870,362 B2

DOCKING APPARATUS

CROSS-REFERENCE AND PRIORITY CLAIM TO RELATED APPLICATIONS

To the full extent permitted by law, the present application claims priority to and the benefit of German application, number 102 16 003.1, entitled "Dockingvorrichtung", filed Apr. 11, 2002, wherein the application is incorporated herein by reference.

BRIEF SUMMARY OF THE INVENTION

The present invention refers to a docking apparatus for coupling a first apparatus consisting of a handler or prober with a second apparatus consisting of testing head for electronic components, according to the preamble of claim 1.

BACKGROUND OF THE INVENTION

For testing electronic components, such as integrated circuits (IC) it is known to use a testing apparatus having a testing head which must be connected to a handling device for the electronic component, such as a handler or prober. In order to facilitate docking of the testing head having a weight of up to 1000 kg to the handling device in a manner as simple, easy and precise as possible, special docking devices, i.e. coupling devices, have been developed which are attached on the one hand on the handling device and on the other hand on the testing head. It is, however, a drawback of such prior art docking devices that they do not always enable docking of the testing head in the desired simple, easy and precise manner and moreover are costly and have a complex structure.

BRIEF DESCRIPTION OF THE INVENTION

It is thus an object of the present invention to provide a docking apparatus of the above kind having a simple and inexpensive structure and enabling simple, easy and precise coupling of the handling device to the testing head.

The object is solved according to the present invention by the features of claim 1. Advantageous embodiments of the present invention at least one locking unit are described in the dependent claims.

In the docking apparatus of the present invention at least one locking unit is provided attached on a docking plate, comprising:

an axial insertion opening for inserting the locking pin.
a plurality of balls arranged in the area of the insertion opening, between which the locking pin is insertable.
a ball clamping sleeve enabling, in a first axial position, a radial position of the balls outside of the insertion area of the locking pin, in which the locking pin is insertable between the balls, and locking, in a second axial position, the balls in a locked position, in which the balls protrude into a circumferential groove of the inserted locking pin.

The docking apparatus according to the present invention enables a very simple, smooth and precise docking of the testing head at the handling device and can be manufactured relatively easily and cheaply. Moreover, the docking apparatus may be formed very easily in such a way that the locking unit(s) may be very easily attached at various places of the docking plate, so that when changing the type of testing head or handling device often only the locking units need to be attached at different positions of the docking plate in order to fit to a different testing head or a different handling device. The docking apparatus is therefore also more easily adaptable to various device types.

It is particularly advantageous if the insertion opening for the locking pin comprises a centering section formed as a centering bore of the locking pin. The docking apparatus therefore not only serves as a contraction apparatus but also as a centering means allowing the testing head to be centered precisely with respect to the handling device.

According to an advantageous embodiment, the locking unit comprises a threaded sleeve having an internal thread and being rotatable by the actuating means. Herein, the ball clamping sleeve is non-rotatable, however it is displaceable in an axial direction and has an external thread running in mesh with the internal thread of the threaded sleeve, so that rotating the threaded sleeve is coupled with an axial movement of the ball clamping sleeve. Thus, the threaded sleeve acts as some kind of axially fixed spindle nut, while the non-rotatable ball clamping sleeve is comparable to a spindle that is axially displaced by rotating the threaded sleeve.

According to an advantageous embodiment, the ball clamping sleeve comprises a ball clamping section radially protruding to the inside and having a dome-shaped ball guiding surface. When the balls move along the dome-shaped ball clamping section, they are forced to carry out a movement in the radial direction as well as the axial movement, enabling the balls to be brought in and out of locking engagement with the locking pin. The movement of the balls along the dome-shaped ball clamping section can for example be effected by moving the ball clamping sleeve in an axial direction against a limit stop protruding into the receiving space of the balls, the limit stop, from a certain axial position onwards, preventing the balls from being moved further in an axial direction, whereupon, with a further axial movement of the ball clamping sleeve, the balls are moved by the limit stop along the dome-shaped ball clamping section and therefore radially to the inside. Instead of a dome-shaped form of the ball clamping section, other shapes are also possible, such as tapering angular surfaces.

According to a particularly advantageous embodiment, the actuating means for locking and unlocking the locking pin is comprised of a Bowden wire means coupled to the threaded sleeve in such a way that the latter may be caused to rotate by the Bowden wire means. Such Bowden wire means enable the individual locking units to be attached at various positions on the docking plate, without the actuating means having to be adapted in any special way.

It is also advantageous for the threaded sleeve to be mounted to be rotatable within a housing portion attached on a mounting plate. Thus, all parts of a locking unit are on a mounting plate, so that only the attachment plate need be screwed off and attached at the new desired position on the docking plate if a displacement of a locking unit is required. This enables in a particularly efficient way a simple and quick relocation of the locking units.

According to an advantageous embodiment, the balls are arranged in a ball cage moveable in a radial direction and fixed in an axial direction with respect to the ball cage. To do this, the ball cage suitably has radial guides for the balls, precisely guiding the balls in an axial direction and only allowing a movement in the radial direction.

According to an advantageous embodiment, the ball cage is axially displaceable with respect to the docking plate and has a limit stop surface for the locking pin. The limit stop surface is arranged in such a way that the circumferential groove of the locking pin abutting on the limit stop surface faces the balls. In this case, the ball cage is moved in an axial direction together with the balls by the locking pin itself until the ball cage has reached its axial end position. The movement of the ball cage is suitably carried out against the biasing force of a spring. This enables very soft docking, since the locking pin already inserted in the insertion guide does not abruptly impact on a fixed axial stop but the axial stop may still be displaced a bit further in the axial direction against the increasing force of a spring. In this way, also intermediate axial positions are possible, in which the locking pin has not yet been locked by the balls, however does experience a certain retention force, so that manual alignment of the, testing head is still possible without the risk of the locking pin being withdrawn from the insertion opening.

According to an advantageous embodiment, three locking units are provided on the docking plate, into each of which a locking pin is insertably mounted on the opposite device. A different number of locking units is easily possible, such as two, four or five locking units.

BRIEF DESCRIPTION OF THE DRAWINGS

The invention will be explained in more detail in the following with reference to the accompanying drawings, in which:

FIG. 1 is a schematic view of a handling device, a testing head and a docking apparatus for coupling the two devices;

FIG. 2 is schematic view of a locking unit by itself;

FIGS. 6a, 6b are schematic views to illustrate various possibilities for attaching the locking units on a docking plate;

DETAILED DESCRIPTION OF THE INVENTION

Figure 3:
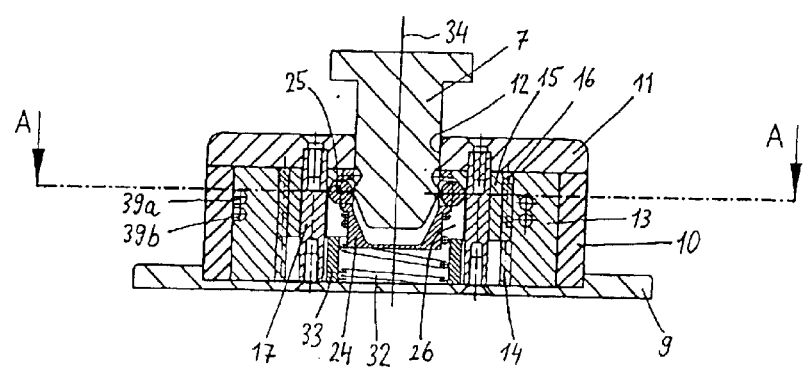
FIG. 3 is a sectional view along line B—B of FIG. 4 of a locking unit, where a locking pin is shown at the beginning of the insertion process.

With reference to FIG. 1, a handling device 1 as well as a testing head 2 are shown. For docking the testing head 2 to the handling device 1, a docking plate 3 is used attachable either directly on the handling device 1 or on an intermediary frame (not shown), an overall number of three locking units 4 being attached on the docking plate 3. The locking units 4 are disposed in three corner areas of the docking plate 3 and mechanically coupled to a handling portion 6 via a Bowden wire means 5, the handling portion 6 being in the fourth corner of the docking plate 3.

Three locking pins 7 are attached on the testing head 2 and protrude beyond the testing head 2 and, as will be described in the following in more detail, are capable of being brought into engagement with the locking units 4.

The docking of the testing head 2 on the handling device 1 is done in such a way that first the testing head 2 is moved toward the handling device 1 or the docking plate 3 until the locking pins 7 are inserted in central insertion openings 8, referenced in FIGS. 1 and 2, of the locking units 4, allowing the testing head 2 to be centered. Next, the locking units 4 are actuated by turning the handling portion 6 in such a way that the locking pins 7, and thus also the testing head 2, are drawn further to the docking plate 3 up to the end position, and is locked in this position.

Figure 4:
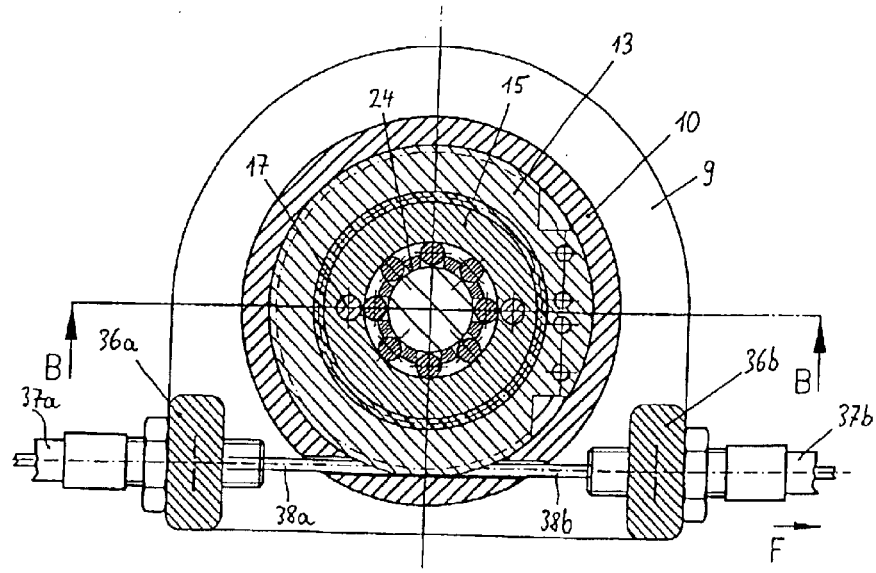
FIG. 4 is a sectional view taken along the line A—A of FIG. 3.

With reference to FIGS. 3 and 4, in the following, the structure and operation of the locking units 4 is more fully explained. The three locking units shown in FIG. 1 are formed to be identical. As can be seen in particular from FIG. 3, each locking unit 4 has an attachment plate 9, which may be screwed to the docking plate 3 by means of screws (not particularly shown).

An annular or sleeve-shaped housing portion 10 having a circular cross section is attached on the attachment plate 9. The top of the housing portion 10 is covered by a circular cover 11 having a central centering bore 12. The diameter of this centering bore 12 is precisely matched to the outer diameter of the cylindrical locking pin 7, so that a tight fit is provided. Alternatively it is also possible to provide the centering bore 12 in a separate centering bush (not shown) inserted in the cover 11. The centering bore 12 and an adjacent receiving space 26 for a ball cage 24 to be described in more detail below, together form the insertion opening 8 for the centering pin 7.

Within the housing portion 10, a threaded sleeve 13 in the form of a hollow cylinder is rotatable, the threaded sleeve 13 having its outer circumferential surface lying against the inner circumferential surface of the housing portion 10. The threaded sleeve 13 has an internal thread 14 extending over its entire axial length.

Within the threaded sleeve 13, a ball clamping sleeve 15 is arranged to be axially displaceable, having an external thread 16 on its outer circumference. This external thread 16 is in mesh with the internal thread 14 of the threaded sleeve 13. Further, the ball clamping sleeve 15 is fixed in a non-rotatable manner within the housing portion 10 by two axial guiding pins 17 axially extending through the ball clamping sleeve 15. The ball clamping sleeve 15 therefore may be displaced in an axial direction in the manner of a spindle, when the threaded sleeve 13 is rotated.

Figure 7:
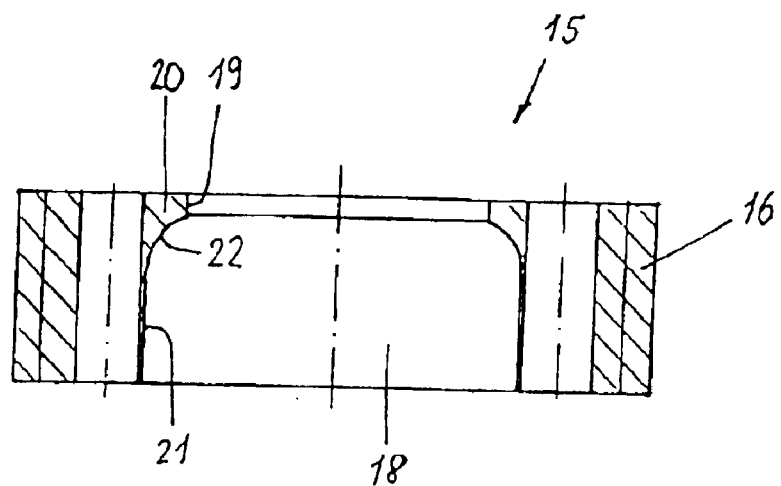
FIG. 7 is a sectional view of a ball clamping sleeve by itself.

The structure of the threaded sleeve 13 is shown in more detail in FIG. 7. The threaded sleeve has a central, axial passage 18 having various diameters. The top end section 19 of the passage 18 thus has a smaller diameter than the main section 21 due to a web 20 protruding radially to the inside. The main section 21 and the end section 19 are linked by a dome-shaped intermediary section 22, serving as a ball guiding surface. The web 20 is a ball clamping section, as will be explained in more detail below. Moreover, two through bores 23 are provided radially outside of the passage 18, serving to receive the guiding pins 17.

As can be seen from FIGS. 3 and 4, the locking unit 4 has a ball cage 24 serving to guide and hold balls 25. The ball cage 24 in turn is centrally disposed and has a smaller outer diameter than the clear diameter of the end section 19 of the ball clamping sleeve 15. The ball cage 24 is therefore displaceable in an axial direction with respect to the ball clamping sleeve 15, the ball clamping sleeve 15 surrounding the ball cage 24.

Figure 8:
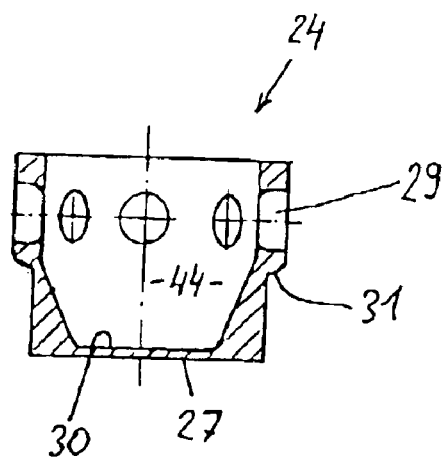
FIG. 8 is a sectional view of a ball cage.

The ball cage 24 is shown by itself in FIG. 8. The ball cage 24 is essentially cup-shaped and has an annular circumferential side wall 28 as well as a flat bottom 27. In the upper area of the side wall 28, a total number of eight radially extending ball entry openings 29 are provided, penetrating the side wall 28 and regularly spaced about its circumference.

The diameter of the ball entry openings 29, at the radial outer end, is a bit greater than that of the balls 25, so that the balls 25 may move radially from the outside to the inside into the ball entry openings 29. At the radial inner end, the diameter of the ball entry openings 29, however, is a bit smaller than that of the balls 25, which prevents the balls 25 from completely falling into the cavity of the ball cage 24. The cavity of the ball cage 24 is slightly conical toward the bottom and is therefore adapted to the form of the free end area of the locking pin 7.

The bottom end of the cavity forms a limit stop surface 30 for the end face of the locking pin 7. Further, the outer diameter of the bottom section of the ball cage 24 is smaller than that of the top section, so that a circumferential shoulder 31 is formed serving as an abutment surface of the spring 32 (FIG. 3).

As can be further seen from FIGS. 3 and 5a-5c, a guiding ring 33 is provided between the ball clamping sleeve 15 and the ball cage 24. This guiding ring 33 extends upwards from the attachment plate 9 only over a smaller part of the overall height up to the cover 11 and is for radial guidance of the spring 32 and the ball cage 24, which may plunge into the guiding ring 33.

The ball cage 24 is biased upwardly, i.e. away from the attachment plate 9, by the spring 32, the spring 32 being supported at the bottom by the attachment plate 9 and at the top by the shoulder 31 of the ball cage 24. The spring 32 extends in a space between the ball cage 24 and the guiding ring 33.

In order for the cage 24 to be able to execute an axial movement, the height of the ball cage 24 is considerably smaller than the distance between the attachment plate 9 and the cover 11.

The threaded sleeve 13 can be rotated by means of a Bowden wire means 5 about the central rotary axis 34. To do this, the Bowden wire means 5 has two Bowden wire holders 36a, 36b fixed at opposite ends of the attachment plate 9, to which ends wire cable sleeves 37a, 37b may be fixed coming from opposing sides. The wire 38a is passed around the threaded sleeve 13 counter-clockwise and is fixed to the end side thereof. The wire 38b is passed clockwise around the threaded sleeve 13 and is also fixed to the end side thereof. The wires 38a, 38b are disposed in outer circumferential grooves 39a, 39b (FIG. 3). Further, the wires 38a, 38b are connected to a drum (not shown in more detail) within the handling portion 6 (FIG. 1), so that upon rotating the drum by means of a hand lever 40, one wire is wound up and the other wire is unwound. Depending on the direction in which the handling portion 6 is rotated, the threaded sleeve 13 is therefore also rotated to the right or to the left.

With reference to the FIGS. 5a-5c the docking operation will now be described in more detail.

Figure 5A:
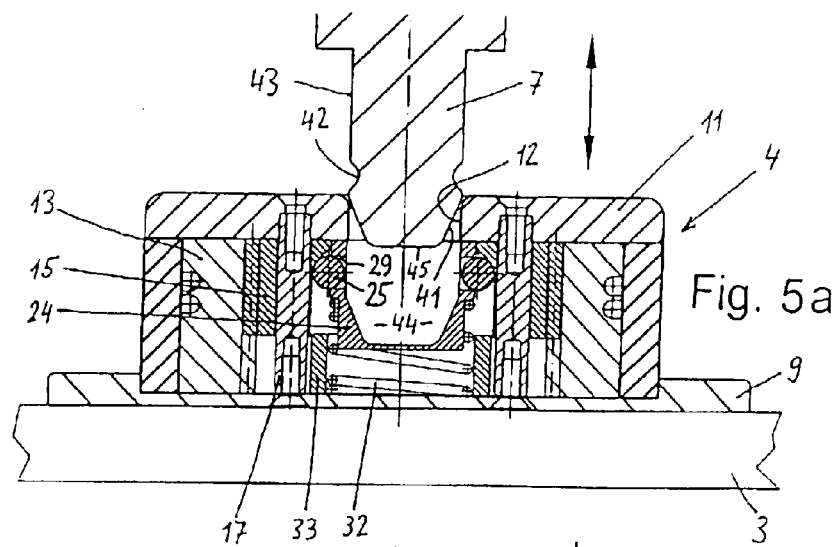
FIGS. 5a–5c show the locking unit together with the locking pin of FIG. 3, wherein the different insertion positions of the locking pin are shown.

In FIG. 5a, the beginning of the entry of the locking pin 7 into the centering bore 12 of the cover 11 is shown. In order to facilitate insertion of the locking pin 7, the latter has a conical end area 41. Adjacent to this conical end area 41, there is a circumferential groove 42, extending round the entire circumference of the locking pin 7. Adjacent to the circumferential groove 42, in turn, there is a cylindrical centering section 43. In this position, the threaded sleeve 13 is rotated back to such an extent that the ball clamping sleeve 15 is in the uppermost position, i.e. adjacent to the cover 11. In this position, the balls 25 have sufficient radial play toward the outside, to pass completely outside the cavity 44 of the ball cage 24. Due to the compressive force of the spring 32, the ball cage 24 is in its topmost position, where it abuts against the cover 11. In the position shown in FIG. 5a, the conical end area 41 of the locking pin 7 thus only acts together with the centering bore 12 in such a way that a certain pre-centering of the locking pin 7 and therefore the testing head 2 is effected.

Figure 5B:
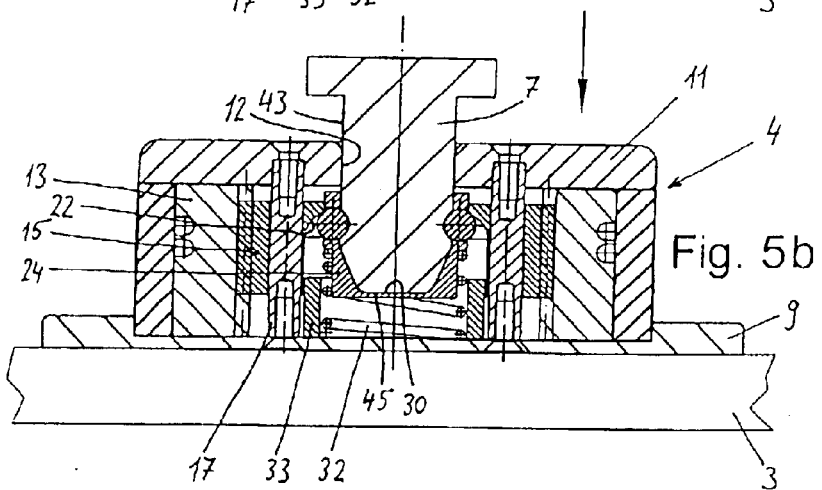

An intermediate position is shown in FIG. 5b, in which the locking pin has been inserted into the locking unit 4 to such an extent that the centering section 43 of the locking pin 7 comes to lie within the centering bore 12 and therefore a centering of the testing head 2 is ensured. Furthermore, in this position, the end face 45 of the locking pin 7 abuts against the bottom limit stop surface 30 of the ball cage 24, already slightly displacing the ball cage 24 to the bottom against the force of the spring 32. In this position, the ball entry openings 29 of the ball cage 24 directly face the circumferential groove 42 of the locking pin 7, so that the balls 25 may be moved to the inside and enter into the circumferential groove 42. This is done by rotating the threaded sleeve 13 via the Bowden wire means 5, so that the ball clamping sleeve 15 is moved to the bottom, i.e. away from the cover 11. If the ball clamping sleeve 15 is moved in an axial direction to the bottom further than the ball cage 24, and if there is thus a relative movement between these two parts, then the balls 25 are urged toward the inside by the dome-shaped intermediary section 22 of the ball clamping sleeve 15. In this intermediary position, the locking pin 7 has been slightly axially fixed by the balls 25, so that it may not easily be withdrawn from the insertion openings 8. At the same time, however, a certain flexibility is provided in an axial direction, since the locking pin 7 and therefore the testing head 2 may still be manually adjusted in the insertion direction, wherein the ball cage 24 moves independently of the ball clamping sleeve 15 against the force of the spring 32 in the direction of the attachment plate 9.

Figure 5C:
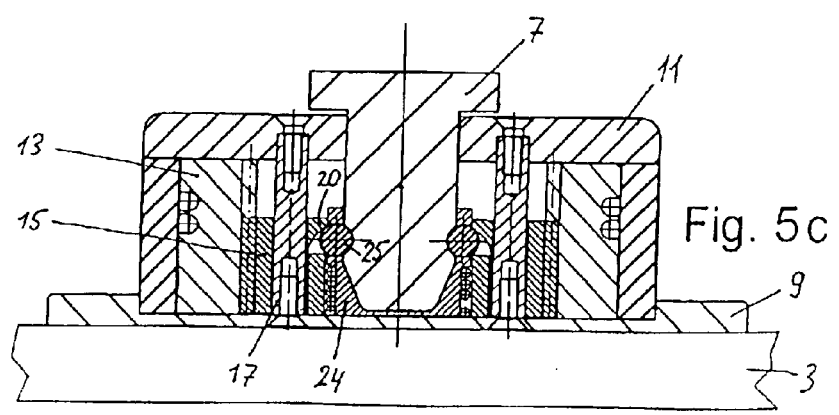

A complete drawing-in and locking of the locking pin 7 is done by rotating the threaded sleeve 13 by means of the Bowden wire means 5 to such an extent that the ball clamping sleeve 15 is in the position shown in FIG. 5c near the attachment plate 9. In the axial movement of the ball clamping sleeve 15 from the position shown in FIG. 5b to the one shown in FIG. 5c, the balls 25 are carried along in an axial direction and simultaneously urged to the inside into the circumferential groove 42 of the locking pin 7. Via the balls 25, therefore, both the ball cage 24 and the locking pin 7 are moved along in an axial direction. In the locking position shown in FIG. 5c, the ball cage 24 is also adjacent to the attachment plate 9. The locking pin 7 and therefore also the testing head 2 are both centered and axially locked.

On order to release the locking pin 7 from the locking unit 4, the threaded sleeve 13 is turned back by means of the Bowden wire means 5 in the opposite direction to the starting position shown in FIG. 5a, again creating sufficient radial space for the balls 25, so that the balls 25 may exit from the circumferential groove 42 and release the locking pin 7.

With reference to FIGS. 6a and 6b it may be seen that the locking units 4 may easily be attached at various positions of the docking plate 3 without the Bowden wire means 5 itself having to be changed. In FIG. 6a, the locking units 4 and the handling part 6 have been screwed into attachment openings 46 of the docking plate 3, relatively close to the edge of the docking plate 3. The Bowden wire is relatively extended. In FIG. 6b, however, the locking units 4 and the handling portion 6 are further to the inside, the Bowden wire buckling to the outside.

What is claimed is:

1. A docking apparatus for coupling a first apparatus consisting of a handler or prober to a second apparatus consisting of a testing head for electronic components, comprising:

a docking plate attachable to one of the apparatuses, to which docking plate at least one locking unit is provided, at least one locking pin arranged at the other apparatus, capable of being brought into locking engagement with the associated locking unit, and an actuating means for locking and unlocking the locking pin inserted in the locking unit, characterized in that the locking unit comprises:

an axial insertion opening for inserting the locking pin, a plurality of balls arranged in the area of the insertion opening, between which the locking pin is insertable, a ball clamping sleeve enabling, in a first axial position, a radial position of the balls outside of the insertion area of the locking pin, in which the locking pin is insertable between the balls, and locking, in a second axial position, the balls in a locking position, in which the balls protrude into a circumferential groove of the inserted locking pin.

2. The docking apparatus of claim 1, characterized in that the locking unit comprises a threaded sleeve having an internal thread and rotatable by means of the actuating means, and in that the ball clamping sleeve is arranged to be non-rotatable, however displaceable in its axial direction and having an external thread in mesh with the internal thread of the threaded sleeve, so that a rotation of the threaded sleeve is coupled with an axial movement of the ball clamping sleeve.

3. The docking apparatus according to claim 1, characterized in that the ball clamping sleeve comprises a ball clamping section protruding radially to the inside and having a dome-shaped ball guiding surface.

4. The docking apparatus according to claim 1, characterized in that the actuating means for locking and unlocking the locking pin is comprised of a Bowden wire means.

5. The docking apparatus according to claim 4, characterized in that the threaded sleeve is coupled to the Bowden wire means and rotatable by the latter.

6. The docking apparatus according to claim 1, characterized in that the threaded sleeve is rotatable within a housing portion fixed on an attachment plate.

7. The docking apparatus according to claim 1, characterized in that the balls are arranged in a ball cage moveable in a radial direction and fixed in an axial direction with respect to the ball cage.

8. The docking apparatus according to claim 7, characterized in that the ball cage is arranged axially displaceable with respect to the docking plate and has a limit stop surface for the locking pin, wherein the limit stop surface is arranged in such a way that the circumferential groove of the locking pin abutting at the limit stop surface faces the balls.

9. The docking apparatus according to claim 7, characterized in that the ball cage is biased by a spring in such a way that the ball cage is urged away from the docking plate.

10. The docking apparatus according to claim 1, characterized in that the three locking units are provided on the docking plate, into each of which a locking pin attached to the opposing apparatus is insertable.

11. The docking apparatus according to claim 1, characterized in that the insertion opening comprises a centering section formed on the centering bore for the locking pin.

* * * * *